United States Patent
Tokuno et al.

(10) Patent No.: US 9,448,678 B2
(45) Date of Patent: Sep. 20, 2016

(54) CAPACITIVE TRANSPARENT TOUCH SHEET HAVING EXCELLENT VISIBILITY AND DURABILITY

(71) Applicant: NISSHA PRINTING CO., LTD., Kyoto-shi, Kyoto (JP)

(72) Inventors: Katsumi Tokuno, Kyoto (JP); Takanori Yoshida, Kyoto (JP); Yoshihiro Nii, Kyoto (JP); Takako Ueno, Kyoto (JP); Yuhei Abe, Kyoto (JP); Tsunetomo Aisaka, Kyoto (JP); Eiko Seki, Kyoto (JP); Yoko Kawashima, Kyoto (JP); Kaori Maenaka, Kyoto (JP); Kazumasa Takahashi, Kyoto (JP)

(73) Assignee: NISSHA PRINTING CO., LTD., Kyoto (JP)

( * ) Notice: Subject to any disclaimer, the term of this patent is extended or adjusted under 35 U.S.C. 154(b) by 11 days.

(21) Appl. No.: 14/403,522

(22) PCT Filed: May 28, 2013

(86) PCT No.: PCT/JP2013/064808
§ 371 (c)(1),
(2) Date: Nov. 24, 2014

(87) PCT Pub. No.: WO2013/180142
PCT Pub. Date: Dec. 5, 2013

(65) Prior Publication Data
US 2015/0138139 A1  May 21, 2015

(51) Int. Cl.
*G06F 3/044* (2006.01)
*H01R 4/04* (2006.01)
(Continued)

(52) U.S. Cl.
CPC ......... *G06F 3/044* (2013.01); *B29C 45/14065* (2013.01); *B29C 45/14467* (2013.01);
(Continued)

(58) Field of Classification Search
None
See application file for complete search history.

(56) References Cited

U.S. PATENT DOCUMENTS 9,007,309 B2 *  4/2015  Hinata ............... G06F 3/045
                                                    345/173
2009/0211818 A1 *  8/2009  Kondo ............. G06F 3/0414
                                                     178/18.03

FOREIGN PATENT DOCUMENTS

EP        2615528 A1    7/2013
JP       H07-171408 A   7/1995
(Continued)

OTHER PUBLICATIONS

International Search Report in PCT/JP2013/064808 dated Sep. 3, 2013.

*Primary Examiner* — Kenneth B Lee, Jr.
(74) *Attorney, Agent, or Firm* — Global IP Counselors, LLP

(57) ABSTRACT

A capacitive transparent touch sheet has excellent visibility and durability without changing the sensitivity, size, or the like of a touch panel. The capacitive transparent touch sheet comprises: a first conductive sheet including a first substrate to be adhered to the hard substrate, and a plurality of strip shaped first electrodes formed separately on a surface of the first substrate to be adhered to the hard substrate; a second conductive sheet including a second substrate disposed to oppose the first substrate, a plurality of strip shaped second electrodes formed on a surface of the second substrate opposing the first substrate and arranged to cross the first electrodes, and at least one insulation part formed continuously with the second electrodes, the at least one insulation part having a thickness the same as that of the second electrodes; and an adhesive layer that bonds the first and second conductive sheets together.

19 Claims, 7 Drawing Sheets

(51) Int. Cl.
- *H01Q 1/40* (2006.01)
- *H01R 43/24* (2006.01)
- *H01Q 1/24* (2006.01)
- *B29C 45/14* (2006.01)
- *H05K 3/10* (2006.01)
- *H05K 7/02* (2006.01)
- *G06F 1/16* (2006.01)
- *H05K 3/00* (2006.01)
- *H05K 3/40* (2006.01)
- *B29L 31/34* (2006.01)
- *H05K 1/02* (2006.01)

(52) U.S. Cl.
CPC ........... *B29C45/14639* (2013.01); *G06F 1/16* (2013.01); *H01Q 1/243* (2013.01); *H01Q 1/40* (2013.01); *H01R 4/04* (2013.01); *H01R 43/24* (2013.01); *H05K 3/0014* (2013.01); *H05K 3/101* (2013.01); *H05K 3/4015* (2013.01); *H05K 7/02* (2013.01); *B29C 2045/14114* (2013.01); *B29L 2031/3437* (2013.01); *B29L 2031/3481* (2013.01); *G06F 2203/04112* (2013.01); *H05K 1/0284* (2013.01); *H05K 2201/0999* (2013.01); *H05K 2201/09118* (2013.01); *H05K 2201/10318* (2013.01)

(56) References Cited

FOREIGN PATENT DOCUMENTS

| | | | |
|---|---|---|---|
| JP | 2009-199318 | A | 9/2009 |
| JP | 2009-294815 | A | 12/2009 |
| JP | 2010-061425 | A | 3/2010 |
| JP | 2010-165460 | A | 7/2010 |
| JP | 4862969 | B1 | 1/2012 |
| JP | 2012-181816 | A | 9/2012 |

\* cited by examiner

CAPACITIVE TRANSPARENT TOUCH SHEET HAVING EXCELLENT VISIBILITY AND DURABILITY

BACKGROUND

1. Field of the Invention

The present invention relates to a capacitive transparent touch sheet used in a capacitive touch panel and more particularly relates to a capacitive transparent touch sheet having high durability and wherein electrodes, which are formed in the capacitive transparent touch sheet, are not visualized as a pattern when the capacitive transparent touch sheet is adhered onto a transparent base material.

2. Background Information

Conventionally, capacitive touch panels are used as touch panels. FIG. 11 is an exploded oblique view of a conventional capacitive touch panel, and FIG. 12 is a plan view of the conventional capacitive touch panel. With reference to FIG. 11, a conventional capacitive touch panel 200 is configured by adhering together an upper part conductive sheet α, which comprises an upper part base material 100 and upper part electrodes 101, and a lower part conductive sheet β, which comprises a lower part base material 110 and lower part electrodes 111. Furthermore, the upper part conductive sheet α and the lower part conductive sheet β are adhered together such that the upper part electrodes 101 and the lower part electrodes 111 cross one another (See, e.g., Japanese Unexamined Patent Application Publication No. H7-171408).

However, the upper part electrodes 101 and the lower part electrodes 111 are formed separately and both have a constant thickness. Consequently, in the conventional capacitive touch panel 200, the thickness of the locations at which the upper part electrodes 101 and the lower part electrodes 111 cross, namely, the thickness of intersecting portions γ between the upper part electrodes 101 and the lower part electrodes 111, is greater than the thickness particularly of locations δ at which the upper part electrodes 101 and the lower part electrodes 111 are not formed.

As a result, steps arise in the surface of the touch panel 200, and therefore, there is a problem in that, when shimmering light is radiated to the touch panel 200, the light is refracted by the step portions and the entire touch panel 200 adversely appears as if it is wavy.

Furthermore, there is a problem in that, because the intersecting portions γ are thicker than the other portions and form protruding shapes, fatigue accumulates over repeated use and thereby short circuits adversely occur during usage.

To solve the aforementioned problems, a method is known that adheres a cushioning sheet, which eliminates the steps, to the surface of the upper part conductive sheet α or the lower part conductive sheet β; however, in this method, there is a problem in that the overall thickness of the touch panel 200 increases, and therefore the touch panel 200 cannot be made compact.

In addition, there is also another method that improves the visibility of the touch panel 200 by reducing the thickness of the upper part electrodes 101 and the lower part electrodes 111, thereby reducing the steps created at the intersecting portions γ as much as possible; however, in this method, there is a problem in that, because the resistance value of the electrodes adversely increases commensurately with the reduction in the thickness of the electrodes, the sensitivity of the touch panel 200 adversely decreases.

SUMMARY

The present invention solves the aforementioned problem with the conventional art, and an object of the present invention is to provide a capacitive transparent touch sheet having excellent visibility and durability without changing the sensitivity and/or the size of the touch panel.

The abovementioned technical solution is described below.

A capacitive transparent touch sheet for adhering to a transparent hard substrate according to one disclosed non-limiting embodiment of the present disclosure includes: a first conductive sheet that comprises a first substrate adhered to the hard substrate, and a plurality of strip shaped first electrodes formed separately on a surface of the first substrate to be adhered to the hard substrate; a second conductive sheet that includes a second substrate disposed to oppose the first substrate, a plurality of strip shaped second electrodes formed on a surface of the second substrate opposing the first substrate and arranged to cross the first electrodes, and at least one insulation part formed continuously with the second electrodes, the at least one insulation part having a thickness the same as that of the second electrodes; and an adhesive layer that bonds the first conductive sheet and the second conductive sheet together.

A capacitive transparent touch sheet for adhering to a transparent hard substrate according to another disclosed non-limiting embodiment of the present disclosure includes: a first conductive sheet that comprises a first substrate adhered to the hard substrate, and a plurality of strip shaped first electrodes formed separately on the first substrate; a second conductive sheet including a second substrate disposed to oppose the first substrate, a plurality of strip shaped second electrodes formed on a surface of the second substrate on the side opposite the surface opposing the first substrate and arranged to cross the first electrodes, and at least one insulation part formed continuously with the second electrodes, the at least one insulation part having a thickness the same as that of the second electrodes; and an adhesive layer that bonds the first conductive sheet and the second conductive sheet together.

A further embodiment of the present disclosure includes, wherein the thickness of the second electrodes is greater than the thickness of the first electrodes.

A further embodiment of any of the foregoing embodiments of the present disclosure includes, wherein the first electrodes comprise a transparent metal oxide; the second electrodes comprise a plurality of conductive nanofibers, each of conductive nanofibers being conductively connected, and a binder resin for holding the plurality of conductive nanofibers on the second substrate; and the at least one insulation part comprises the binder resin that constitutes the second electrodes without the conductive nanofibers.

A further embodiment of any of the foregoing embodiments of the present disclosure includes, wherein the width of each of the second electrodes is greater than the width of the at least one insulation part.

A further embodiment of any of the foregoing embodiments of the present disclosure includes, wherein the transparent metal oxide is ITO.

A further embodiment of any of the foregoing embodiments of the present disclosure includes, wherein the metal that constitutes the conductive nanowires is silver.

A further embodiment of any of the foregoing embodiments of the present disclosure includes, a hard coat layer formed on a surface of the second substrate opposite the surface where the second electrodes are formed.

A capacitive transparent touch panel according to one disclosed non-limiting embodiment of the present disclosure includes: the capacitive transparent touch sheet according to any of the foregoing embodiments of the present disclosure; and a transparent base material is adhered onto the substrate of the capacitive transparent touch sheet.

The capacitive transparent touch sheet of the present invention has excellent visibility and durability without changing the sensitivity and/or the size of the touch panel.

DETAILED DESCRIPTION OF EMBODIMENTS

Embodiments according to the present invention are explained in further detail below, based on the drawings. Furthermore, the dimensions, materials, or shapes of the areas, relative portions, and the like described in the working examples of the present invention, and their relative positions and the like, are merely explanatory examples that, unless particularly and specifically noted, do not purport to limit the scope of the present invention.

First Embodiment

Figure 1:
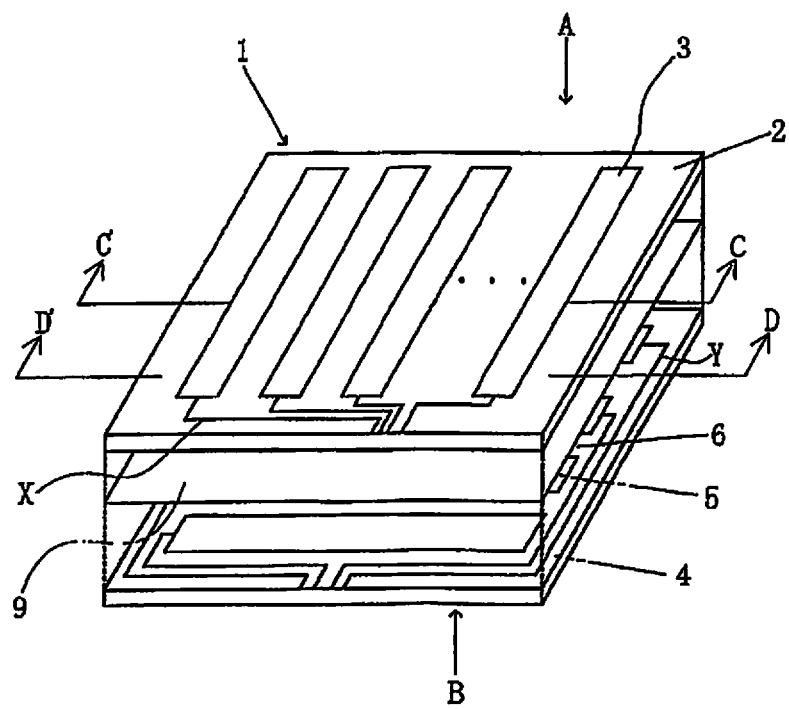
FIG. 1 is an exploded oblique view of a capacitive transparent touch sheet according to a disclosed embodiment.
Figure 2:
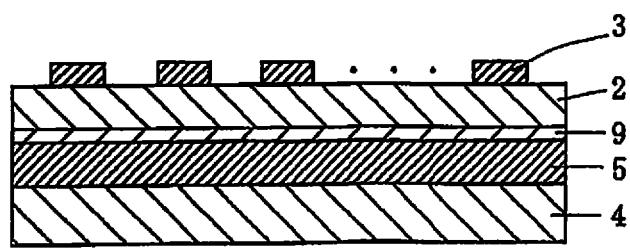
FIG. 2 is a cross sectional enlarged view of FIG. 1.
Figure 3:
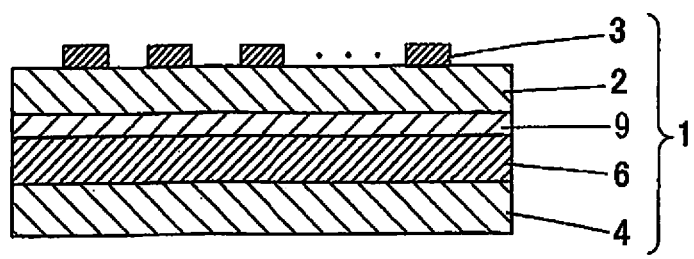
FIG. 3 is a cross sectional enlarged view of FIG. 1.
Figure 4:
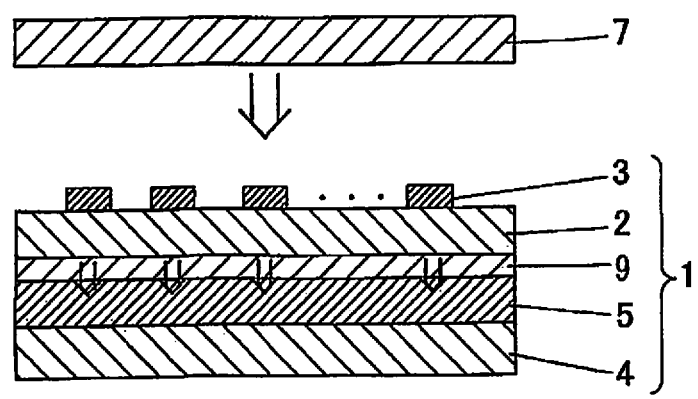
FIG. 4 is a cross section that shows the point in time when the capacitive transparent touch sheet of the embodiment shown in FIG. 1 is adhered to a transparent base material.

FIG. 1 is an exploded oblique view of a capacitive transparent touch sheet 1 according to a first embodiment. FIG. 2 is a cross sectional view taken along the C-C' line of the capacitive transparent touch sheet 1 in FIG. 1. FIG. 3 is a cross sectional view taken along the D-D' line of the capacitive transparent touch sheet 1 in FIG. 1. Furthermore, the cross section taken along the C-C' line is a cross sectional view that shows a section of the capacitive transparent touch sheet 1 cut along second electrodes 5, and the cross section taken along the D-D' line is a cross sectional view that shows the capacitive transparent touch sheet 1 cut along an insulation part 6. FIG. 4 is a cross sectional view that shows the point in time when the capacitive transparent touch sheet 1 of the first embodiment is adhered to a transparent base material 7.

With reference to FIG. 1, the capacitive transparent touch sheet 1 comprises: a first conductive sheet A that includes a first substrate 2, a plurality of strip shaped first electrodes 3 formed separately on the first substrate 2, and first lead circuits X that electrically connect the first electrodes 3 externally; and a second conductive sheet B that includes a second substrate 4 disposed such that it opposes the first substrate 2, the strip shaped second electrodes 5 formed on the second substrate 4, the insulation parts 6 formed continuously with the second electrodes 5 and whose thickness is the same as that of the second electrodes 5, and second lead circuits Y that electrically connect the second electrodes 5 externally; and an adhesive layer 9 that bonds the first conductive sheet A and the second conductive sheet B together. With reference to FIG. 1, each of the insulation parts 6 is a region which is located between each pair of adjacent second electrodes 5.

With reference to FIG. 1, FIG. 2, and FIG. 3, the capacitive transparent touch sheet 1 of the first embodiment differs from a conventional touch sheet in that the insulation parts 6 are formed continuously with the second electrodes 5 such that the surface of the second conductive sheet B is smooth and, furthermore, has a thickness that is the same as that of the second electrodes 5. By configuring the capacitive transparent touch sheet 1 in this manner, the steps that appear on the surface can be made smaller than in a conventional capacitive transparent touch sheet. As a result, when shimmering light is radiated, it is possible to prevent the entire capacitive transparent touch sheet 1 from appearing as if it is wavy.

Furthermore, if the surface of the second conductive sheet B becomes smooth, then the difference between the thickness of the intersecting portions between the first electrodes 3 and the second electrodes 5 and the thickness of the other portions becomes small. As a result, compared with conventional capacitive transparent touch sheets, fatigue tends not to accumulate at the intersecting portions, which makes it possible to also reduce the incidence of the problem wherein a short circuit adversely occurs during usage of the capacitive transparent touch sheet.

The components that constitute the capacitive transparent touch sheet 1 are explained below.

<First Substrate and Second Substrate>

Resin films, such as acrylic, polycarbonate, polyester, polybutylene terephthalate, polypropylene, polyamide, polyurethane, polyvinyl chloride, polyvinyl fluoride, and polyimide, can be given as examples of the material of the first substrate 2 and the second substrate 4. The thicknesses of the first substrate 2 and the second substrate 4 can be set, as appropriate, in the range of 5-800 µm. If the thickness is less than 5 µm, handling becomes difficult because the strength as a layer is insufficient and therefore the layer tears when it is peeled; if the thickness exceeds 800 µm, the layer is too stiff, and therefore fabrication becomes difficult and it is no longer possible to obtain flexibility.

<First Electrodes and Second Electrodes>

In FIG. 1, the first electrodes 3 and the second electrodes 5 each comprise a plurality of strip shaped electrodes, but the electrodes are not limited to being strip shaped. For example, the first electrodes 3 may comprise a plurality of rhombic electrodes connected in diagonal directions, and the second electrodes 5 may comprise a plurality of rhombic electrodes connected in diagonal directions. In such a case, the rhombic electrodes that constitute the first electrodes 3 and the rhombic electrodes that constitute the second electrodes 5 may be disposed such that they do not overlap one another when viewed from a direction normal to the surface. By thusly disposing the first electrodes 3 and the second electrodes 5 such that they do not overlap, the detection sensitivity in the transverse directions and the detection sensitivity in the longitudinal directions can be made such that they do not affect one another. In addition, in FIG. 1, a plurality of the first electrodes 3 and a plurality of the second electrodes 5 are provided, but the present invention is not limited thereto and an arbitrary number of each can be provided.

Any appropriate material can be used as the material of the first electrodes 3 and the second electrodes 5, as long as the material is electrically conductive. Preferably, as a combination of materials that constitute the first electrodes 3 and the second electrodes 5, the first electrodes 3 comprise a transparent metal oxide, and the second electrodes 5 comprise an electrically conductive material made of a photosetting resin binder and conductive nanofibers.

ITO can be given as an example of the transparent metal oxide. Examples that can be given as the conductive nanofiber are: a metal nanowire that is prepared by impressing a voltage or an electric current from a tip part of a probe to the surface of a precursor that supports a metal ion, such as gold, silver, platinum, copper, palladium, or the like, and then continuously drawing the nanowire; a peptide nanofiber, which is made by adding metal particles to a nanofiber that is formed by the self-assembly of a peptide or a derivative thereof; or the like. In addition, even blackish conductive nanofibers, such as carbon nanotubes, can be used if a difference can be discerned in, for example, the color, the reflectivity, or the like at the shadow. In addition, urethane acrylate, cyanoacrylate, or the like can be given as examples of the photosetting resin binder.

Furthermore, among those described above, as a more preferable combination, ITO may be used as the transparent metal oxide, silver nanofibers may be used as the conductive nanofibers, and urethane acrylate may be used as the photosetting resin binder.

If configured in this manner, the transparency of the first electrodes 3 and the second electrodes 5 increases. Furthermore, the transparency of the first electrodes 3 becomes greater than that of the second electrodes 5. As a result, it is possible to eliminate the problem of the visualization of the pattern of the first electrodes 3 because the shape of the first electrodes 3, the pattern of which naturally has high transparency and therefore tends not to be visualized, is concealed further by the second electrodes 5. In addition, the problem of pattern visualization does not occur for the second electrodes 5. This is because, unlike the case of the first electrodes 3, the insulation parts 6, whose thickness is the same as that of the second electrodes 5 and whose material is substantially the same as that of the second electrodes 5, are disposed in an area adjacent to the second electrodes 5, and therefore there is virtually no difference in the transparency, the refractive index, and the like between the second electrodes 5 and the insulation parts 6. As a result, if the first electrodes 3 and the second electrodes 5 are configured with the materials mentioned above, it is possible to produce a capacitive transparent touch sheet 1 wherein the overall transparency is high and the pattern visualization of electrodes is extremely unlikely.

The thicknesses of the first electrodes 3 and the second electrodes 5 can be appropriately set in the range of several tens of nanometers to several hundred nanometers. If the thickness is less than several tens of nanometers, then the strength as a layer is insufficient; furthermore, if the thickness is greater than several hundred nanometers, then the flexibility becomes insufficient.

Furthermore, the thickness of the second electrodes 5 is preferably greater than the thickness of the first electrodes 3. With reference to FIG. 4, if the thickness of the second electrodes 5 is greater than the thickness of the first electrodes 3, then, when the capacitive transparent touch sheet 1 is adhered to the transparent base material 7, the second electrodes 5 can incorporate the thickness of the first electrodes 3. As a result, the thickness of the first electrodes 3 is no longer reflected as a pattern in the surface of the capacitive transparent touch sheet 1 (the surface of the second substrate 4). Thereby, the surface of the capacitive transparent touch sheet 1 (the surface of the second substrate 4) becomes smooth. In so doing, even if shimmering light is radiated to the capacitive transparent touch sheet 1, the light is no longer refracted at the surface, and therefore the entire capacitive transparent touch sheet 1 no longer appears as if it is wavy. Furthermore, it is also possible to prevent the electrodes from fatiguing at the intersecting portions between the first electrodes 3 and the second electrodes 5.

In addition, the thickness of the second electrodes 5 is preferably the same as that of the insulation parts 6 and is preferably in the range of 1-50 µm. If it is less than 1 µm, then there are cases in which the electrical conductivity of the second electrodes 5 is insufficient; if the thickness exceeds 50 µm, then the second electrodes 5 are too thick, which results in the problem wherein the capacitive transparent touch sheet 1 cannot be made compact.

In addition, the width of each of the second electrodes 5 is preferably greater than the width of each of the insulation parts 6. If the width of the second electrodes 5 is less than the width of each of the insulation parts 6, then the problem arises wherein the capacitive transparent touch sheet 1 cannot be produced with high sensitivity because the portions that function as sensors are too narrow.

<Insulation Part>

The width of each of the insulation parts 6 is preferably approximately 10-100 µm. The lower limit is set to 10 µm because, if the insulation parts 6 are formed with a width of less than 10 µm, then ion migration occurs during use, which creates a short circuit between electrodes. Moreover, the upper limit is set to 100 µm because, if the width exceeds 100 µm, then, for example, the insulation parts 6 can adversely be visually discerned when illuminated, the sensitivity of the capacitive transparent touch sheet 1 would adversely decrease, and the like. In addition, the depth of the insulation parts 6 is the same as the thickness of the second electrodes 5, and the resin material of the insulation parts 6 is the same as the binder resin that constitutes the second electrodes 5.

<Adhesive Layer>

The adhesive layer 9 is a layer for adhering the first conductive sheet A and the second conductive sheet B to one another. A resin having thermosensitivity and pressure sensitivity suited to the type of the first substrate 2 and the second substrate 4 may be used as the material of the adhesive layer 9. Specifically, a resin such as a PMMA based resin, a PC, polystyrene, PA based resin, a poval based resin, a silicone based resin, or the like may be used. Furthermore, the adhesive layer 9 is formed on the first substrate 2 or the second substrate 4 by a gravure coating method, a roll coating method, a comma coating method, a gravure printing method, a screen printing method, an offset printing method or the like.

Furthermore, instead of the adhesive layer 9 formed between the first conductive sheet A and the second conductive sheet B, a double-sided adhesive sheet comprising the abovementioned resin may be used.

Figure 5:
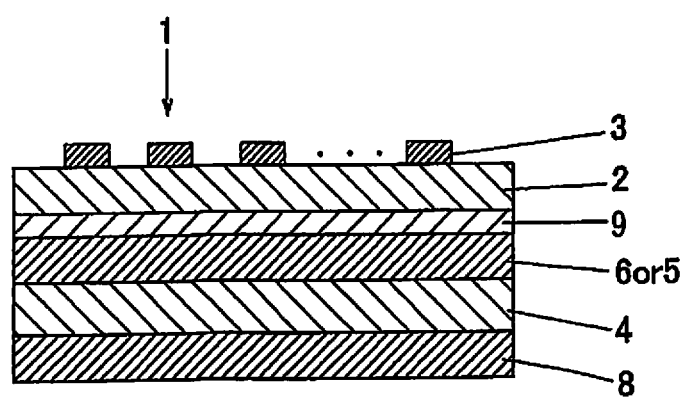
FIG. 5 is a cross sectional view of the capacitive transparent touch sheet as shown in FIG. 1.

FIG. 5 is a cross sectional view of the capacitive transparent touch sheet 1 according to another working example of the first embodiment. With reference to FIG. 5, in the capacitive transparent touch sheet 1 of the first embodiment, a hard coat layer 8 is formed on the surface of the second substrate 4, on the side opposite the surface on which the second electrodes 5 are formed, with the adhesive layer 9 interposed therebetween.

<Hard Coat Layer>

The hard coat layer 8 is a layer that is disposed on the surface of the touch panel when the touch panel is produced using the capacitive transparent touch sheet 1. By disposing the hard coat layer 8 on the surface of the touch panel, the first conductive sheet A, the second conductive sheet B, and the like can be protected from physical or chemical damage. That is, the damage resistance, the chemical resistance, and the like of the touch panel surface can be improved.

The film thickness of the hard coat layer 8 is preferably in the range of 1-20 µm. If the film thickness of the hard coat layer 8 is less than 1 µm, then it is too thin, and consequently the abovementioned functions can no longer be sufficiently exhibited. Conversely, if the film thickness of the hard coat layer 8 exceeds 20 µm, then the hard coat layer 8 will no longer dry immediately, which is not preferable from the viewpoint of production efficiency.

In addition to an acrylic—such as polymethyl methacrylate, polyethyl methacrylate, polyethyl acrylate, or polybutyl acrylate—a methacryl monomer homopolymer, or a copolymer acrylic based resin containing these monomers, it is also possible to use a melamine based resin, an acrylic based resin, a urethane based resin, an epoxy based resin, or the like as the material of the hard coat layer 8.

Specifically, it is possible to use, for example: a one-liquid curing type resin such as melamine, acrylic melamine, epoxy melamine, alkyd, urethane, acrylic, or the like; a resin that is a mixture of these; a two-liquid curing type resin made by combining any of the aforementioned with a curing agent, such as isocyanate; or an ultraviolet light or electron beam setting resin comprising a monomer, a prepolymer, or the like having an ethylenic unsaturated bond, such as polyester acrylate, polyester methacrylate, epoxy acrylate, epoxy methacrylate, urethane acrylate, urethane methacrylate, polyether acrylate, polyether methacrylate, polyol acrylate, melamine acrylate, melamine methacrylate, or the like. Furthermore, if an ultraviolet light setting resin is used, then a photoinitiator is further added.

Next, a conductive nanofiber sheet manufacturing method according to the first embodiment will be explained.

<Capacitive Transparent Touch Sheet Manufacturing Method>

The method for manufacturing the capacitive transparent touch sheet 1 includes the processes below.

(a) Prepare the first substrate 2.

(b) Form an electrically conductive layer, which is made of ITO, on the entire surface of the first substrate 2.

(c) Using a photoresist method or the like to pattern the electrically conductive layer to form the first electrodes 3 on the first substrate 2, thereby obtaining the first conductive sheet A.

(d) Prepare the second substrate 4.

(e) Using a printing method to form an electrically conductive layer, which includes the conductive nanofibers, on the entire surface of the second substrate 4.

(f) Radiate an energy ray, for example, a laser, to part of the electrically conductive layer to form the insulative layer wherein some of the conductive nanofibers have been removed. The insulation parts 6 are formed by radiating an energy ray, such as a carbon dioxide gas laser having a spot diameter of several tens of microns, to break up the conductive nanofibers. Thereby, the second conductive sheet B is obtained wherein the second electrodes 5 and the insulation parts 6 are formed on the second substrate 4.

(g) Adhere the first conductive sheet A and the second conductive sheet B together.

Furthermore, other than the method that forms the insulation parts using the abovementioned laser, there may be, for example: a method that uses a photosetting resin in the binder resin, causes the photosetting resin to produce its effects by the irradiation of light, and develops the unset resin, thereby eliminating such; and a method that forms an etching resist layer made of an alkyd resin, a polyester resin, an epoxy resin, or the like on part of the electrically conductive layer, then etches the entire surface of the etching resist layer by an acid, an alkaline aqueous solution, or the like, and removes, by etching, the part of the electrically conductive layer on which the etching resist layer is not formed.

However, if a photosetting resin is used in the abovementioned binder resin or if an etching method is used, then there is a problem in that the width of each of the insulation parts 6 cannot be made smaller than a certain degree. Consequently, the number of the second electrodes 5 that can be formed on the second substrate 4 is limited.

Accordingly, in the capacitive transparent touch sheet manufacturing method of the first embodiment, the insulation parts 6 are formed using a laser. Using laser makes it possible to form the insulation parts 6 with a width such that the insulation parts 6 cannot be visually discerned. Consequently, the number of the second electrodes 5 can be increased.

In the capacitive transparent touch sheet 1 obtained by the method above, the second electrodes 5 and the insulation parts 6 are formed continuously, and the difference in the materials that constitute the two lies only in the presence/absence of the conductive nanofibers, and therefore there is virtually no difference in their transmittance and refractive index. Consequently, the pattern visualization of the second electrodes 5 and the insulation parts 6 can be reduced considerably. In addition, if the first conductive sheet A and second conductive sheet B prepared by this method are laminated, it is possible to manufacture a capacitive type touch panel wherein the transmittance of the display screen is uniform and the reduction in pattern visualization of the first electrodes 3, the second electrodes 5, and the insulation parts 6 are excellent.

Second Embodiment

Figure 6:
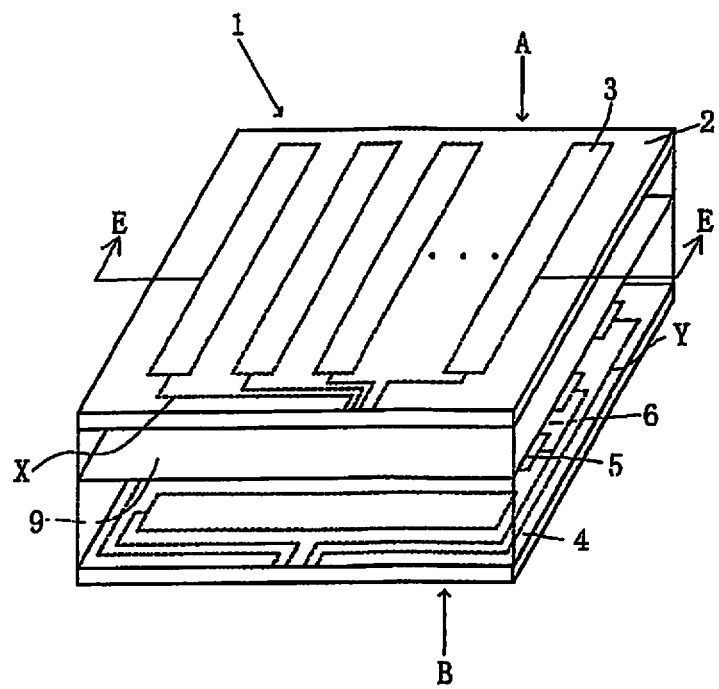
FIG. 6 is an exploded oblique view of another capacitive transparent touch sheet as shown in FIG. 1.
Figure 7:
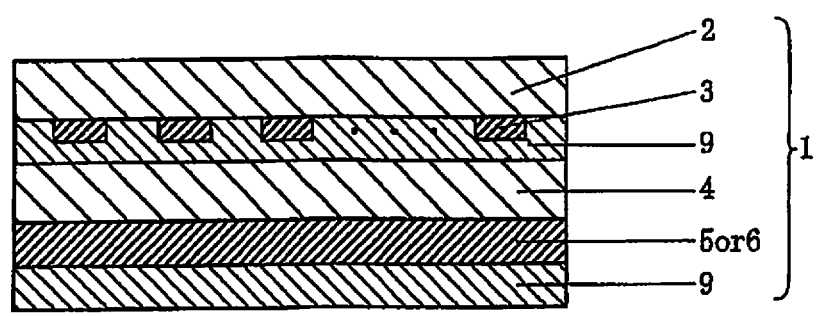
FIG. 7 is a cross sectional enlarged view of FIG. 6.

FIG. 6 is an exploded oblique view that shows the configuration of the capacitive transparent touch sheet 1 of a second embodiment. FIG. 7 is a cross sectional view of the capacitive transparent touch sheet 1 viewed from the E-E' direction in FIG. 6. The basic configuration of the second embodiment is the same as that of the first embodiment, and therefore only points that are different from those of the first embodiment will be explained below.

With reference to FIG. 6 and FIG. 7, the capacitive transparent touch sheet 1 of the second embodiment comprises: the first conductive sheet A that comprises the first substrate 2 and the plurality of strip shaped first electrodes 3 formed separately on the first substrate 2; the second conductive sheet B that comprises the second substrate 4 disposed such that it opposes the first substrate 2, the plurality of strip shaped second electrodes 5 formed on the surface of the second substrate 4 on the side opposite the surface that opposes the first substrate 2 such that the second electrodes 5 cross the first electrodes 3, and the insulation parts 6 formed continuously with the second electrodes 5 and whose thickness is the same as that of the second electrodes 5; and the adhesive layer 9 that bonds the first conductive sheet A and the second conductive sheet B together.

With reference to FIG. 6 and FIG. 7 once again, the capacitive transparent touch sheet 1 of the second embodiment differs from that of the first embodiment in that the first electrodes 3 are formed between the first substrate 2 and the second substrate 4 with the adhesive layer 9 interposed therebetween, and in that the second electrodes 5 and the insulation parts 6 are formed on the second substrate 4 on the side opposite the first substrate 2.

Figure 8:
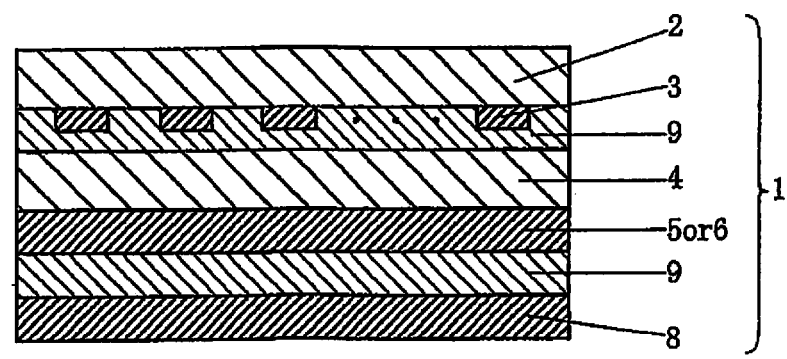
FIG. 8 is a cross sectional view of the capacitive transparent touch sheet as shown in FIG. 1.

FIG. 8 is a cross sectional view of the capacitive transparent touch sheet 1 of the second embodiment. With reference to FIG. 8, in the capacitive transparent touch sheet 1 of the second embodiment, the hard coat layer 8 may be formed on the surface of the second substrate 4 on which the second electrodes 5 are formed, with the adhesive layer 9 interposed therebetween.

<Capacitive Touch Panel>

Figure 9:
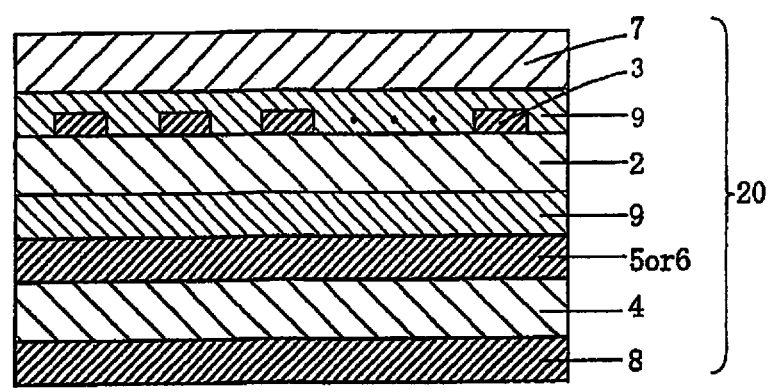
FIG. 9 is a cross sectional view of a capacitive transparent touch panel as shown in FIG. 1.

FIG. 9 is a cross sectional view of a capacitive touch panel 20 that uses the capacitive transparent touch sheet 1 of the first embodiment. The basic configuration of the capacitive touch panel 20 is the same as that of the first embodiment, and therefore only points that are different from those of the first embodiment will be explained below. In the capacitive touch panel 20 of the present embodiment, the capacitive transparent touch sheet 1 of the first embodiment is adhered to the transparent base material 7. Furthermore, with regard to the capacitive transparent touch sheet 1 and the transparent base material 7, the transparent base material 7 and the surface of the first substrate 2 on the side where the first electrodes 3 are formed are adhered to one another with the adhesive layer 9 interposed therebetween.

<Capacitive Touch Panel>

Figure 10:
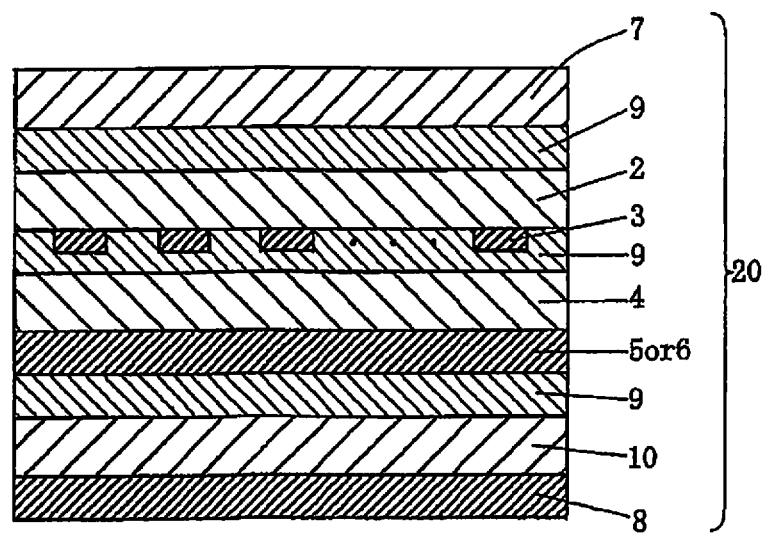
FIG. 10 is a cross sectional view of another capacitive transparent touch panel according to another disclosed embodiment.
Figure 11:
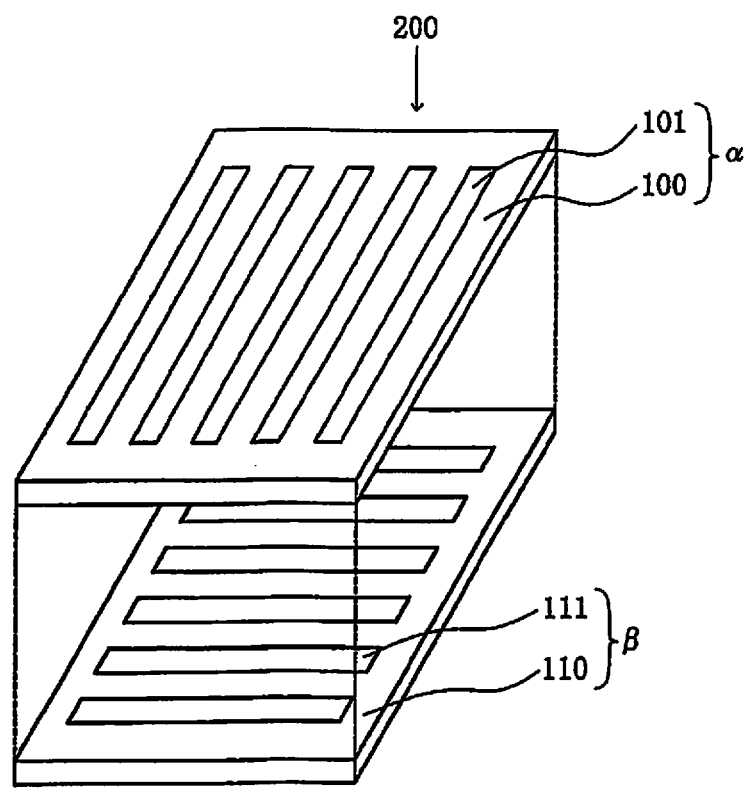
FIG. 11 is an exploded oblique view of a conventional capacitive transparent touch sheet.
Figure 12:
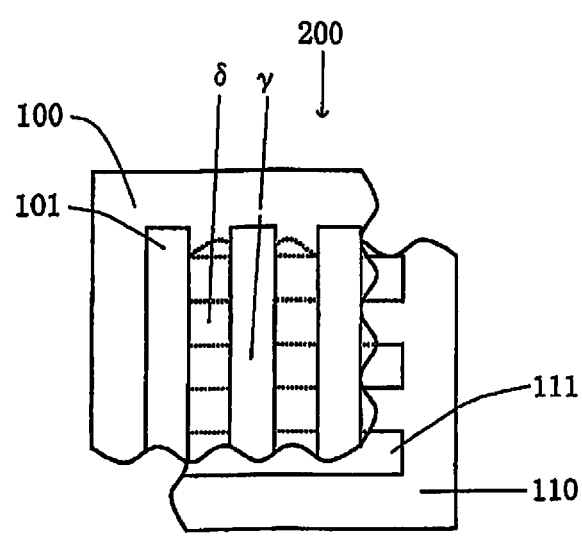
FIG. 12 is a plan view of the conventional capacitive transparent touch sheet.

FIG. 10 is a cross sectional view of the capacitive touch panel 20 that uses the capacitive transparent touch sheet 1 of the second embodiment. The basic configuration of the capacitive touch panel 20 is the same as that of the second embodiment, and therefore only points that differ from those of the second embodiment will be explained below. In the capacitive touch panel 20 of the present embodiment, the capacitive transparent touch sheet 1 of the second embodiment is adhered to the transparent base material 7. Furthermore, with regard to the capacitive transparent touch sheet 1 and the transparent base material 7, the transparent base material 7 and the surface of the first substrate 2 that is opposite to where the first electrodes 3 are formed are adhered to one another with the adhesive layer 9 interposed therebetween. Furthermore, with regard to the capacitive transparent touch sheet 1 and the transparent film 10, the transparent film 10 and the surface of the second substrate 4 where the second electrodes 5 are formed are adhered to one another with the adhesive layer 9 interposed therebetween. The hard coat layer 8 is formed on the outside surface of the transparent film 10.

The invention claimed is:

1. A capacitive transparent touch sheet for adhering to a transparent hard substrate comprising:
   a first conductive sheet that includes a first substrate to be adhered to the hard substrate, and a plurality of strip shaped first electrodes formed separately on a surface of the first substrate to be adhered to the hard substrate, the first electrodes comprising a transparent metal oxide;
   a second conductive sheet that includes a second substrate disposed to oppose the first substrate, a plurality of strip shaped second electrodes formed on a surface of the second substrate opposing the first substrate and arranged to cross the first electrodes, and at least one insulation part formed continuously with the second electrodes; and
   an adhesive layer that bonds the first conductive sheet and the second conductive sheet together;
   the second electrodes comprising a plurality of conductive nanofibers, each of conductive nanofibers being conductively connected, and a binder resin for holding the plurality of conductive nanofibers on the second substrate; and
   the at least one insulation part having a thickness the same as that of the second electrodes and comprising the binder resin that constitutes the second electrodes substantially without the conductive nanofibers.

2. The capacitive transparent touch sheet according to claim 1, wherein
   the transparent metal oxide is ITO.

3. The capacitive transparent touch sheet according to claim 1, wherein
   the conductive nanofibers comprise silver.

4. The capacitive transparent touch sheet according to claim 1, wherein
   the thickness of the second electrodes is greater than the thickness of the first electrodes.

5. The capacitive transparent touch sheet according to claim 1, wherein
   the width of each of the second electrodes is greater than the width of the at least one insulation part.

6. The capacitive transparent touch sheet according to claim 1, further comprising:
   a hard coat layer formed on a surface of the second substrate opposite the surface where the second electrodes are formed.

7. A capacitive transparent touch panel comprising:
   the capacitive transparent touch sheet according to claim 1; and
   a transparent base material is adhered onto the first substrate of the capacitive transparent touch sheet.

8. A capacitive transparent touch sheet for adhering to a transparent hard substrate comprising:
   a first conductive sheet including a first substrate to be adhered to the hard substrate, and a plurality of strip shaped first electrodes formed separately on the first substrate, the first electrodes comprising a transparent metal oxide;
   a second conductive sheet including a second substrate disposed to oppose the first substrate, a plurality of strip shaped second electrodes formed on a surface of the second substrate on the side opposite the surface opposing the first substrate and arranged to cross the first electrodes, and at least one insulation part formed continuously with the second electrodes; and
   an adhesive layer that bonds the first conductive sheet and the second conductive sheet together;
   the second electrodes comprising a plurality of conductive nanofibers, each of conductive nanofibers being conductively connected, and a binder resin for holding the plurality of conductive nanofibers on the second substrate; and
   the at least one insulation part having a thickness the same as that of the second electrodes and consisting only of the binder resin that constitutes the second electrodes without the conductive nanofibers.

9. The capacitive transparent touch sheet according to claim 8, wherein
   the transparent metal oxide is ITO.

10. The capacitive transparent touch sheet according to claim 8, wherein
the conductive nanofibers comprise silver.

11. The capacitive transparent touch sheet according to claim 8, wherein
the thickness of the second electrodes is greater than the thickness of the first electrodes.

12. The capacitive transparent touch sheet according to claim 8, wherein
the width of each of the second electrodes is greater than the width of the at least one insulation part.

13. The capacitive transparent touch sheet according to claim 8, further comprising:
a hard coat layer formed on a surface of the second substrate opposite the surface where the second electrodes are formed.

14. A capacitive transparent touch panel comprising:
the capacitive transparent touch sheet according to claim 8; and
a transparent base material is adhered onto the first substrate of the capacitive transparent touch sheet.

15. A capacitive transparent touch sheet for adhering to a transparent hard substrate comprising:
a first conductive sheet that includes a first substrate to be adhered to the hard substrate, and a plurality of strip shaped first electrodes formed separately on a surface of the first substrate;
a second conductive sheet that includes a second substrate disposed to oppose the first substrate, a plurality of strip shaped second electrodes formed on a surface of the second substrate and arranged to cross the first electrodes, and at least one insulation part formed continuously with the second electrodes, the at least one insulation part having a thickness the same as that of the second electrodes; and
an adhesive layer that bonds the first conductive sheet and the second conductive sheet together;
the second electrodes comprising a plurality of conductive nanofibers, each of conductive nanofibers being conductively connected, and a binder resin for holding the plurality of conductive nanofibers on the second substrate; and
the at least one insulation part comprising the binder resin that constitutes the second electrodes substantially without the conductive nanofibers.

16. The capacitive transparent touch sheet according to claim 15, wherein
the thickness of the second electrodes is greater than the thickness of the first electrodes.

17. The capacitive transparent touch sheet according to claim 15, wherein
the width of each of the second electrodes is greater than the width of the at least one insulation part.

18. The capacitive transparent touch sheet according to claim 15, further comprising:
a hard coat layer formed on a surface of the second substrate opposite the surface where the second electrodes are formed.

19. A capacitive transparent touch panel comprising:
the capacitive transparent touch sheet according to claim 15; and
a transparent base material is adhered onto the first substrate of the capacitive transparent touch sheet.

\* \* \* \* \*